United States Patent
Liu

(10) Patent No.: US 11,165,615 B2
(45) Date of Patent: Nov. 2, 2021

(54) DATA SHIFTING OPERATION APPARATUS AND METHOD HAVING MULTIPLE OPERATION MODES

(71) Applicant: REALTEK SEMICONDUCTOR CORPORATION, Hsinchu (TW)

(72) Inventor: Chih-Hao Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 91 days.

(21) Appl. No.: 16/860,135

(22) Filed: Apr. 28, 2020

(65) Prior Publication Data

US 2021/0211339 A1 Jul. 8, 2021

(30) Foreign Application Priority Data

Jan. 7, 2020 (TW) ................................. 109100480

(51) Int. Cl.
  *H04L 27/26* (2006.01)
(52) U.S. Cl.
  CPC ................................. *H04L 27/2605* (2013.01)
(58) Field of Classification Search
  CPC .................................................. H04L 27/2605
  See application file for complete search history.

(56) References Cited

U.S. PATENT DOCUMENTS

| | | | | |
|---|---|---|---|---|
| 6,954,832 B2* | 10/2005 | Suzuki | ................ | H03M 13/258 341/81 |
| 6,957,375 B2* | 10/2005 | Richardson | ........ | H03M 13/1137 714/752 |
| 6,965,652 B1* | 11/2005 | Burd | ................... | G11B 20/1833 375/341 |
| 7,719,442 B2* | 5/2010 | Liu | ...................... | H03M 13/116 341/51 |
| 7,724,772 B2* | 5/2010 | Lee | ................... | H03M 13/6527 370/466 |

* cited by examiner

*Primary Examiner* — Zhiren Qin
(74) *Attorney, Agent, or Firm* — WPAT, PC

(57) ABSTRACT

The present disclosure provides a data shifting operation apparatus having multiple operation modes that includes a preprocessing circuit, a first and a second shifting circuits and a multiplexer. The preprocessing circuit stores an input data group, having a data amount equal to a desired data amount M, to an under-operation data group, having the data amount equal to a maximum usage data amount N, from a most significant bit, and receives a shift amount S to calculate a total shift amount. The first and the second shifting circuits respectively cyclically shift the under-operation data group for the shift amount and the total shift amount to generate a first and a second shifted data groups. The multiplexer selects S data from the most significant bit of the second shifted data group and (M–S) data from the (N–S)-th bit of the first shifted data group to output a final shifted data group.

10 Claims, 2 Drawing Sheets

DATA SHIFTING OPERATION APPARATUS AND METHOD HAVING MULTIPLE OPERATION MODES

BACKGROUND OF THE INVENTION

1. Field of the Invention

The present disclosure relates to a data shifting operation apparatus and a data shifting operation method having multiple operation modes.

2. Description of Related Art

In a high speed communication system, a quasi-cyclic low density parity check (QC-LDPC) decoder requires shifting circuits to perform data exchange between the check nodes and the bit nodes.

However, in each of the communication protocols, different numbers of data shifting amounts and shifting operation are required to be supported. For the data shifting operation of the data having different data amounts, a multiple of shifting circuits are required for all possible data amounts of data. In other words, each of the data amounts of the data needs a corresponding shifting circuit to perform data shifting operation. Such a method results in greatly increasing control complexity of the hardware circuits. At the same time, the critical path delay of the hardware circuits increases as well. Not only the hardware cost increases, but also the operation efficiency degrades.

SUMMARY OF THE INVENTION

In consideration of the problem of the prior art, an object of the present disclosure is to provide a data shifting operation apparatus and a data shifting operation method having multiple operation modes.

The present disclosure provides a data shifting operation apparatus having multiple operation modes that includes a preprocessing circuit, a first shifting circuit, a second shifting circuit and a multiplexer. The preprocessing circuit is configured to store an input data group, having a data amount equal to a desired data amount M, to an under-operation data group, having the data amount equal to a maximum usage data amount N, from a most significant bit, and is configured to receive a shift amount S to calculate a total shift amount equaling to a subtraction result added by the shift amount, in which the subtraction result is generated by subtracting the desired data amount from the maximum usage data amount, and the desired data amount is smaller than or equal to the maximum usage data amount. The first shifting circuit is configured to cyclically shift the under-operation data group for the shift amount to generate a first shifted data group. The second shifting circuit is configured to cyclically shift the under-operation data group for the total shift amount to generate a second shifted data group. The multiplexer is configured to select S pieces of data from the most significant bit of the second shifted data group and (M−S) pieces of data from the (N−S)-th bit of the first shifted data group, to output a final shifted data group.

The present disclosure also provides a data shifting operation method having multiple operation modes used in a data shifting operation apparatus that includes the steps outlined below. By a preprocessing circuit, an input data group, having a data amount equal to a desired data amount M, is stored to an under-operation data group, having the data amount equal to a maximum usage data amount N, from a most significant bit. By a preprocessing circuit, a shift amount S is received to calculate a total shift amount equaling to a subtraction result added by the shift amount, in which the subtraction result is generated by subtracting the desired data amount from the maximum usage data amount, and the desired data amount is smaller than or equal to the maximum usage data amount. The under-operation data group is cyclically shifted for the shift amount to generate a first shifted data group by a first shifting circuit. The under-operation data group is cyclically shifted for the total shift amount to generate a second shifted data group by a second shifting circuit. S pieces of data from the most significant bit of the second shifted data group is selected and (M−S) pieces of data from the (N−S)-th bit of the first shifted data group is selected to output a final shifted data group by a multiplexer.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present disclosure is to provide a data shifting operation apparatus and a data shifting operation method having multiple operation modes. By using two shifting circuits that are able to perform data shifting operation of the data having the maximum usage data amount to support the data shifting operation of the input data group having different data amounts, the hardware cost can be greatly reduced.

Figure 1:
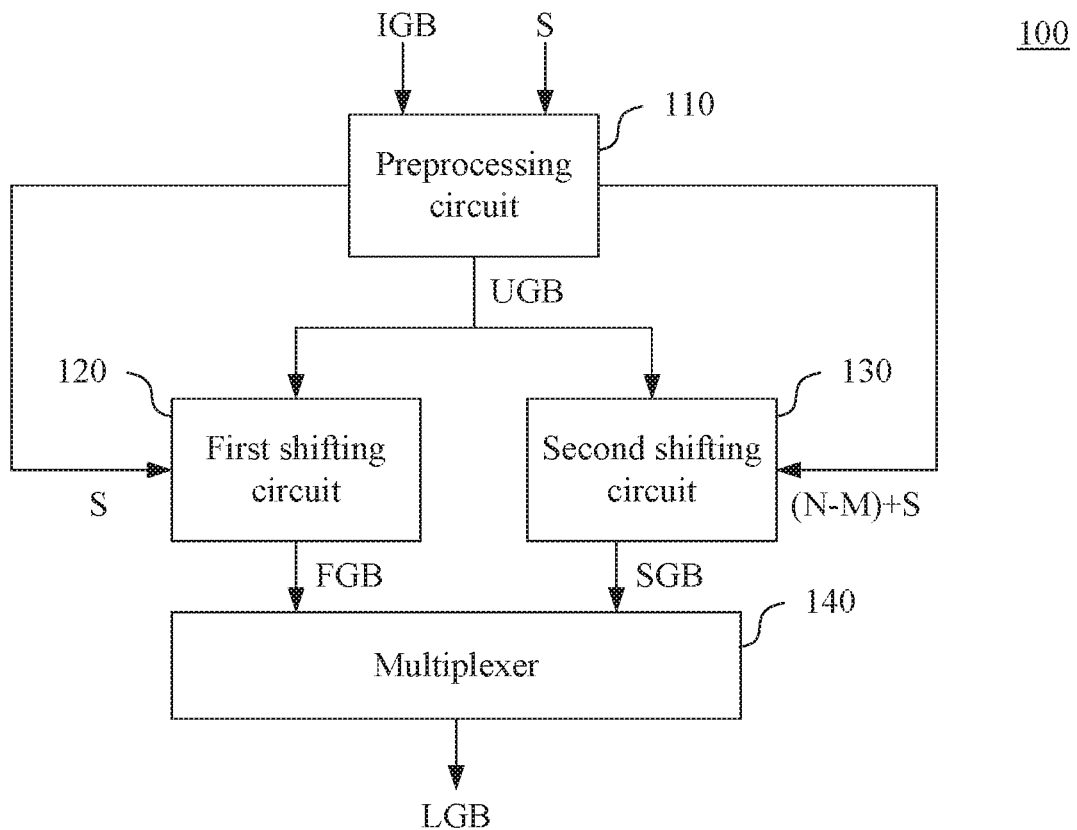
FIG. 1 illustrates a block diagram of a data shifting operation apparatus having multiple operation modes according to an embodiment of the present disclosure.

Reference is now made to FIG. 1. FIG. 1 illustrates a block diagram of a data shifting operation apparatus 100 having multiple operation modes according to an embodiment of the present disclosure. In different operation modes, the data shifting operation apparatus 100 can perform data shifting operation on an input data group IGB that may have different data amounts, in which the largest supported data amount is N. More specifically, in different operation modes, the data shifting operation apparatus 100 can perform cyclic data shifting operation on the input data group IGB having N pieces of data, N−1 pieces of data, . . . to 2 pieces of data.

The data shifting operation apparatus 100 includes a preprocessing circuit 110, a first shifting circuit 120, a second shifting circuit 130 and a multiplexer 140.

The preprocessing circuit 110 is configured to store the input data group IGB, having the data amount equal to a desired data amount M, to an under-operation data group UGB, having the data amount equal to a maximum usage data amount N, from a most significant bit, and the preprocessing circuit 110 is configured to receive a shift amount S to calculate a total shift amount equaling to a subtraction result added by the shift amount, i.e. (N−M)+S, in which the subtraction result is generated by subtracting the desired data amount M from the maximum usage data amount N, and the desired data amount M is smaller than or equal to the maximum usage data amount N.

In an embodiment, the maximum usage data amount N is the largest data amount of the data that the data shifting operation apparatus 100 supports (i.e., the largest data amount that the input data group IGB can have). The desired data amount M is the actual data amount of the input data group IGB. The shift amount S is the amount of data shifting that is supposed to perform on the input data group IGB.

As a result, the under-operation data group UGB includes N pieces of data. The preprocessing circuit 110 stores the input data group IGB having M pieces of data in the under-operation data group UGB from the most significant bit. Further, the total shift amount calculated by the preprocessing circuit 110 is a subtraction result generated by subtracting the desired data amount M from the maximum usage data amount N added by the shift amount, i.e., (N−M)+S.

The first shifting circuit 120 is configured to cyclically shift the under-operation data group UGB for the shift amount S to generate a first shifted data group FGB. More specifically, the first shifting circuit 120 is configured to cyclically shift the under-operation data group UGB for S pieces of data to generate the first shifted data group FGB.

The second shifting circuit 130 is configured to cyclically shift the under-operation data group UGB for the total shift amount (N−M)+S to generate a second shifted data group SGB. More specifically, the second shifting circuit 130 is configured to cyclically shift the under-operation data group UGB for (N−M)+S pieces of data to generate the second shifted data group SGB.

In an embodiment, each of the first shifting circuit 120 and the second shifting circuit 130 is a barrel shifter to perform the cyclic shift. The cyclic shift means that the first shifting circuit 120 and the second shifting circuit 130 are able to shift the data contents of the under-operation data group UGB in the higher bits to the lower bits, and shift the data contents of the under-operation data group UGB originally in the lower bits cyclically to the higher bits at the same time.

The multiplexer 140 is configured to select S pieces of data from the most significant bit of the second shifted data group SGB and (M−S) pieces of data from the (N−S)-th bit of the first shifted data group FGB, to output a final shifted data group LGB that includes the desired data having M pieces of data. The final shifted data group LGB is the cyclic shifting result of the input data group IGB after a shifting of S pieces of data is performed.

Figure 2:
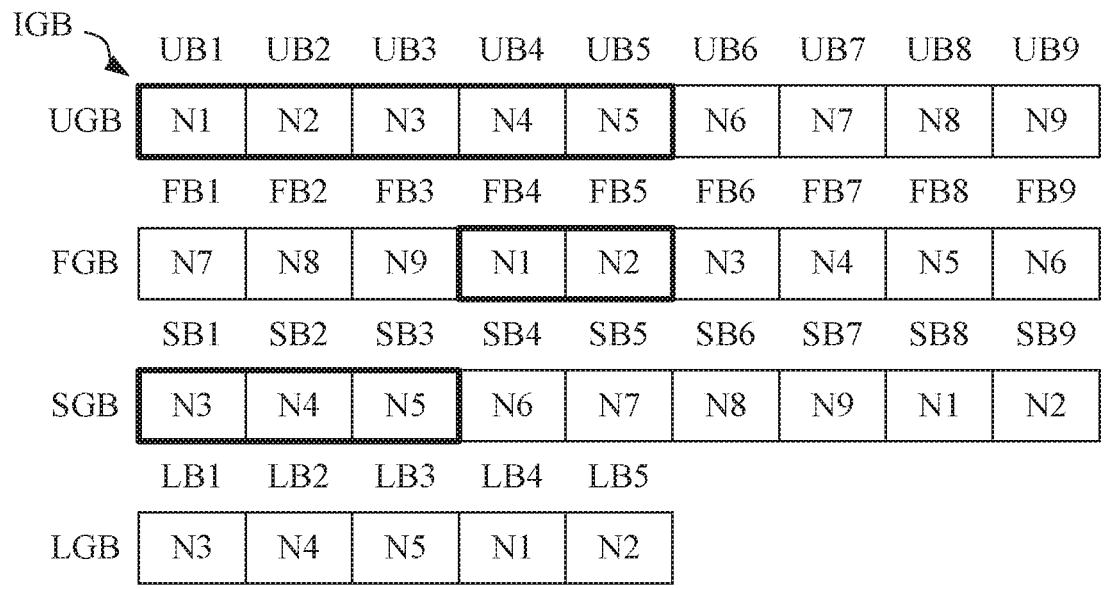
FIG. 2 is a diagram illustrating the under-operation data group, the first shifted data group, the second shifted data group and the final shifted data group according to an embodiment of the present disclosure.

Reference is now made to FIG. 2. FIG. 2 is a diagram illustrating the under-operation data group UGB, the first shifted data group FGB, the second shifted data group SGB and the final shifted data group LGB according to an embodiment of the present disclosure. The operation of the data shifting operation apparatus 100 is described in detail by using a numerical example in accompany with FIG. 1 and FIG. 2.

In the present embodiment, the maximum usage data amount N supported by the data shifting operation apparatus 100 is 9. The desired data amount M of the received input data group IGB is 5. The shift amount S supposed to be used to shift the input data group IGB is 3.

As illustrated in FIG. 2, the data amount of the under-operation data group UGB equals to the maximum usage data amount N, which is 9 in the present embodiment. As a result, the under-operation data group UGB includes 9 pieces of data UB1~UB9. The data of the highest bit (the most significant bit) is UB1 and the data of the lowest bit (the least significant bit) is UB9. The 9 pieces of data UB1~UB9 are used to store data contents N1~N9.

Since the data amount of the input data group IGB is 5, the preprocessing circuit 110 stores the input data group IGB in the first five pieces of data of the under-operation data group UGB from the most significant bit. In other words, the data contents N1~N5 of the pieces of data UB1~UB5 enclosed by a thick-lined frame in FIG. 2 are used to store the input data group IGB. The data contents N6~N9 of the rest 4 pieces of data UB6~UB9 are redundant.

The total shift amount (N−M)+S calculated by the preprocessing circuit 110 is (9−5)+3=7.

Since the shift amount S is 3 in the present embodiment, the first shifting circuit 120 cyclically shifts the under-operation data group UGB for 3 pieces of data to generate the first shifted data group FGB. More specifically, the first shifted data group FGB also has 9 pieces of data FB1~FB9, in which the data contents of the pieces of data FB1~FB3 are N7~N9, and the data contents of the pieces of data FB4~FB9 are N1~N6.

Since the total shift amount (N−M)+S is 7 in the present embodiment, the second shifting circuit 130 cyclically shifts the under-operation data group UGB for 7 pieces of data to generate the second shifted data group SGB. More specifically, the second shifted data group SGB also has 9 pieces of data SB1~SB9, in which data contents of the pieces of data SB1~SB7 are N3~N9, and the data contents of the pieces of data SB8~SB9 are N1~N2.

Figure 3:
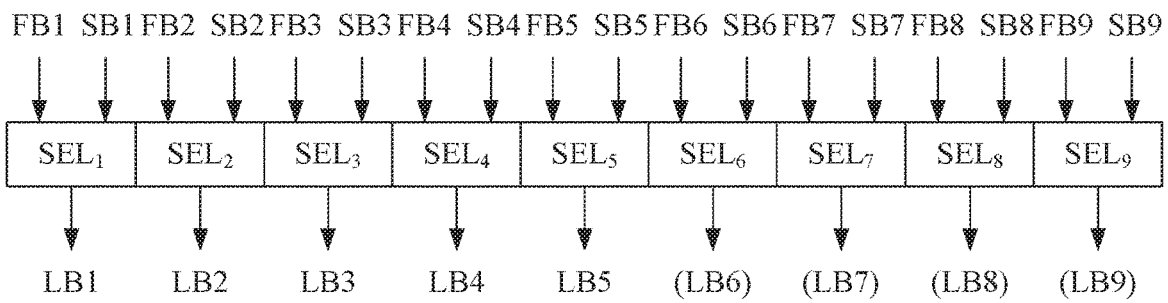
FIG. 3 is a detailed circuit diagram of the multiplexer according to an embodiment of the present disclosure.

Reference is now made to FIG. 3. FIG. 3 is a detailed circuit diagram of the multiplexer 140 according to an embodiment of the present invention.

In the embodiment illustrated in FIG. 3, since the maximum usage data amount N is 9, the multiplexer 140 is implemented by a configuration including 9 selection circuits SEL1~SEL9. The selection circuits SEL1~SEL9 are respectively configured to select one of 9 corresponding pieces of data of the first shifted data group FGB and the second shifted data group SGB to be outputted.

The selection circuit SEL1 is configured to select one of the data FB1 of the first shifted data group FGB and the data SB1 of the second shifted data group SGB to be outputted. The selection circuit SEL2 is configured to select one of the data FB2 of the first shifted data group FGB and the data SB2 of the second shifted data group SGB to be outputted. Identically, the selection circuits SEL3~SEL9 are respectively configured to select one of the data FB3~FB9 of the first shifted data group FGB and the data SB3~SB9 of the second shifted data group SGB to be outputted.

In the present embodiment, since the shift amount S is 3, the multiplexer 140 selects 3 pieces of data from the most significant bit of the second shifted data group SGB to be outputted. More specifically, the selection circuits SEL1~SEL3 of the multiplexer 140 output the data contents N3~N5 stored in the data SB1~SB3 of the second shifted data group SGB enclosed by a thick-lined frame in FIG. 2.

Furthermore, the multiplexer 140 selects M−S pieces of data from the (N−S)-th bit of the first shifted data group FGB to be outputted. Take the numerical example described above, i.e., the maximum usage data amount N is 9, the desired data amount M is 5 and the shift amount S is 3, the selection circuits SEL4~SEL5 of the multiplexer 140 output the data contents N1~N2 stored in the data FB4~FB5 of the first shifted data group FGB, which starts from the sixth piece of data of the first shifted data group FGB, enclosed by a thick-lined frame in FIG. 2.

As a result, the multiplexer 140 selects 3 pieces of data from the second shifted data group SGB and 2 pieces of data from the first shifted data group FGB to output a final shifted data group LGB including data LB1~LB5, in which the data contents of the data LB1~LB5 include N3, N4, N5, N1 and N2. Such a result is equivalent to the data shifting result of the data contents N1~N5 of the input data group IGB for 3 pieces of data.

It is appreciated that the data contents of the N-M pieces of data in the lower bits, e.g., the data LB6~LB9 illustrated in FIG. 3, cannot correspond to the data contents of the input data group that originally has M pieces of data. As a result, the multiplexer 140 may only output M pieces of data without the rest of N-M pieces of data as the final shifted data group LGB.

In another embodiment, in addition to outputting the M pieces of data, the multiplexer 140 may also output the final shifted data group LGB having N pieces of data, while the last N-M pieces of data therein can be random numbers. The subsequent circuit performing operation according to the final shifted data group LGB may neglect the last N-M pieces of data after receiving the final shifted data group LGB.

It is appreciated that the embodiment using the condition that the maximum usage data amount N is 9, the desired data amount M is 5 and the shift amount S is 3 is merely an example. In practical implementation, the maximum usage data amount N, the desired data amount M and the shift amount S can be other values.

Further, since the data shifting operation apparatus 100 performs cyclic shifting operation that shifts the data with a right direction for the shift amount S, such operation is equivalent to shift the data with a left direction for the shift amount M-S, which is the difference between the desired data amount M and the shift amount S. As a result, the data shifting operation apparatus 100 can be used to perform cyclic shifting operation that shifts the data with the left direction as well.

In an embodiment, the input data group IFG is a row of an under-operation matrix, and the under-operation matrix is used in a quasi-cyclic low density parity check (QC-LDPC) decoder.

The QC-LDPC decoder can separate a H matrix used to perform encoding and decoding into a plurality of sub-matrix having smaller size, such that an iterative decoding method using data shifting can be used to update and exchange the information of check nodes and bit nodes.

Since different communication protocols may support different separation methods of the sub-matrix, the sub-matrix of different sizes, the required data amount and the shift amount in the data shifting operation are different. In some approaches, each of the data amounts of the data needs a corresponding shifting circuit to perform data shifting operation. Such a method results in greatly increasing control complexity of the hardware circuits. On the contrary, the data shifting operation apparatus of the present disclosure can use two shifting circuits corresponding to the maximum usage data amount to support the data shifting operation of the input data group having different data amounts. The hardware cost can be greatly reduced.

It is appreciated that the application of the QC-LDPC decoder is merely an example. The application of the data shifting operation apparatus of the present application is not limited thereto.

In some embodiments, each piece of data includes at least one bit.

Figure 4:
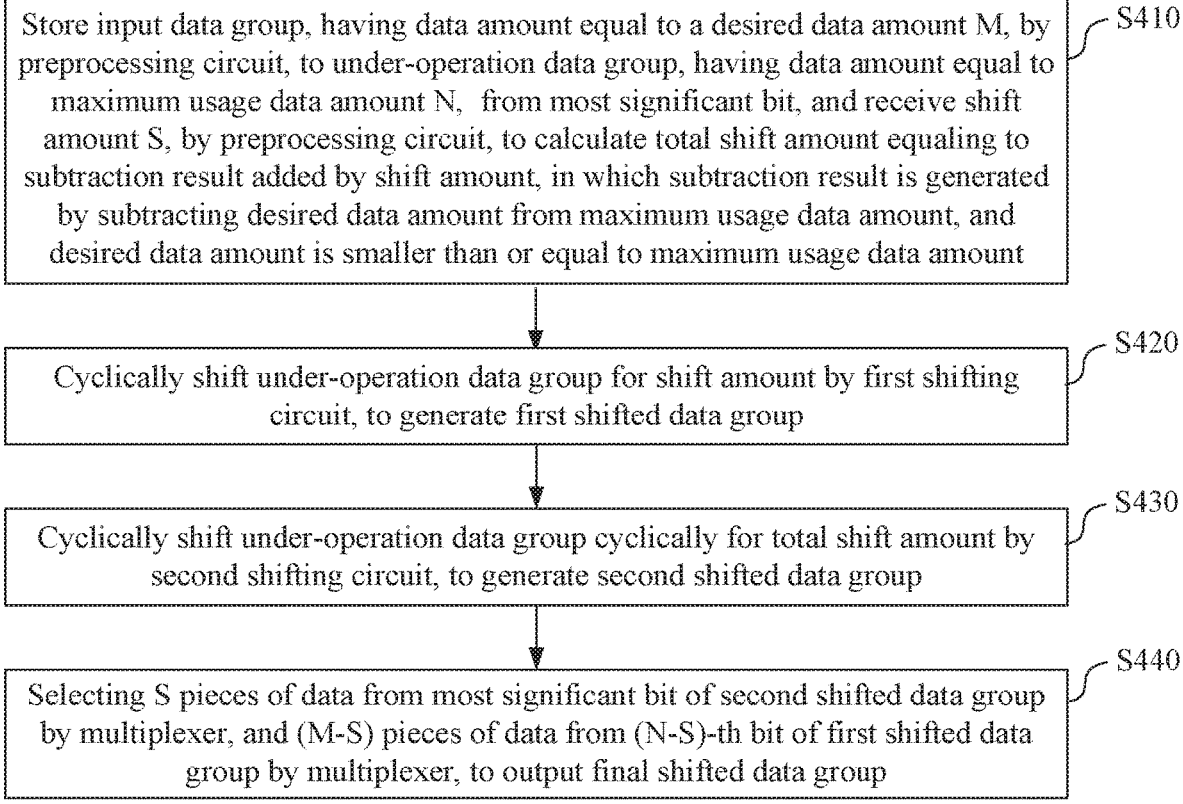
FIG. 4 illustrates a flow chart of a data shifting operation method having multiple operation modes according to an embodiment of the present disclosure.

Reference is now made to FIG. 4. FIG. 4 illustrates a flow chart of a data shifting operation method 400 having multiple operation modes according to an embodiment of the present disclosure.

In addition to the device described above, the present disclosure further provides the data shifting operation method 400 that can be used in such as, but not limited to, the data shifting operation apparatus 100 in FIG. 1. As illustrated in FIG. 4, an embodiment of the data shifting operation method 400 includes the following steps.

In step S410, the input data group IGB, having the data amount equal to the desired data amount M, is stored by the preprocessing circuit 110, to the under-operation data group UGB, having the data amount equal to the maximum usage data amount N, from the most significant bit, and the shift amount S is received, by the preprocessing circuit 110, to calculate the total shift amount equaling to the subtraction result added by the shift amount, in which the subtraction result is generated by subtracting the desired data amount from the maximum usage data amount.

Based on the maximum usage data amount N, the desired data amount M and the shift amount S, the preprocessing circuit 110 can calculate the difference (N-M) between the maximum usage data amount N and the desired data amount M and further calculate the total shift amount (N-M)+S as the sum of the difference N-M and the shift amount S.

In step S420, the under-operation data group UGB is cyclically shifted for the shift amount by the first shifting circuit 120, to generate the first shifted data group FGB.

In step S430, the under-operation data group UGB is cyclically shifted for the total shift amount by the second shifting circuit 130, to generate the second shifted data group SGB.

In step S440, S pieces of data from the most significant bit of the second shifted data group SGB is selected by the multiplexer 140, and (M-S) pieces of data from the (N-S)-th bit of the first shifted data group LGB is selected by the multiplexer 140, to output the final shifted data group LGB.

It is appreciated that the embodiments described above are merely an example. In other embodiments, it should be appreciated that many modifications and changes may be made by those of ordinary skill in the art without departing from the spirit of the disclosure.

In summary, the data shifting operation apparatus and the data shifting operation method having multiple operation modes of the present disclosure can use two shifting circuits that are able to perform data shifting operation of the data having the maximum usage data amount, to support the data shifting operation of the input data group having different data amounts.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:
1. A data shifting operation apparatus having multiple operation modes, comprising:

a preprocessing circuit configured to store an input data group, having a data amount equal to a desired data amount M, to an under-operation data group, having the data amount equal to a maximum usage data amount N, from a most significant bit, and configured to receive a shift amount S to calculate a total shift amount equaling to a subtraction result added by the shift amount, wherein the subtraction result is generated by subtracting the desired data amount from the maximum usage data amount, and the desired data amount is smaller than or equal to the maximum usage data amount;

a first shifting circuit configured to cyclically shift the under-operation data group for the shift amount to generate a first shifted data group;

a second shifting circuit configured to cyclically shift the under-operation data group for the total shift amount to generate a second shifted data group; and a multiplexer configured to select S pieces of data from the most significant bit of the second shifted data group and (M−S) pieces of data from the (N−S)-th bit of the first shifted data group, to output a final shifted data group.

2. The data shifting operation apparatus of claim 1, wherein each of the first shifting circuit and the second shifting circuit is a barrel shifter.

3. The data shifting operation apparatus of claim 1, wherein the multiplexer includes N selection circuits each configured to select one of corresponding data of the first shifted data group and the second shifted data group.

4. The data shifting operation apparatus of claim 1, wherein the input data group is a row of an under-operation matrix.

5. The data shifting operation apparatus of claim 4, wherein the under-operation matrix is used in a quasi-cyclic low density parity check (QC-LDPC) decoder.

6. A data shifting operation method having multiple operation modes used in a data shifting operation apparatus, comprising:

by a preprocessing circuit, storing an input data group, having a data amount equal to a desired data amount M, to an under-operation data group, having the data amount equal to a maximum usage data amount N, from a most significant bit;

by the preprocessing circuit, receiving a shift amount S to calculate a total shift amount equaling to a subtraction result added by the shift amount, wherein the subtraction result is generated by subtracting the desired data amount from the maximum usage data amount, and the desired data amount is smaller than or equal to the maximum usage data amount;

cyclically shifting the under-operation data group for the shift amount to generate a first shifted data group by a first shifting circuit;

cyclically shifting the under-operation data group for the total shift amount to generate a second shifted data group by a second shifting circuit; and selecting S pieces of data from the most significant bit of the second shifted data group and (M−S) pieces of data from the (N−S)-th bit of the first shifted data group, to output a final shifted data group by a multiplexer.

7. The data shifting operation method of claim 6, wherein each of the first shifting circuit and the second shifting circuit is a barrel shifter.

8. The data shifting operation method of claim 6, wherein the multiplexer includes N selection circuits each configured to select one of corresponding data of the first shifted data group and the second shifted data group.

9. The data shifting operation method of claim 6, wherein the input data group is a row of an under-operation matrix.

10. The data shifting operation method of claim 9, wherein the under-operation matrix is used in a quasi-cyclic low density parity check (QC-LDPC) decoder.

\* \* \* \* \*